US012772458B2

(12) United States Patent
Wang

(10) Patent No.: US 12,772,458 B2
(45) Date of Patent: Oct. 20, 2026

(54) SEMICONDUCTOR STRUCTURE WITH VERTICAL TRANSISTOR AND FORMING METHOD THEREFOR

(71) Applicant: CHANGXIN MEMORY TECHNOLOGIES, INC., Hefei City (CN)

(72) Inventor: Xiaoguang Wang, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 695 days.

(21) Appl. No.: 18/156,459

(22) Filed: Jan. 19, 2023

(65) Prior Publication Data

US 2023/0157033 A1 May 18, 2023

Related U.S. Application Data

(63) Continuation of application No. PCT/CN2021/120735, filed on Sep. 26, 2021.

(30) Foreign Application Priority Data

Mar. 18, 2021 (CN) ........................ 202110289188.6

(51) Int. Cl.
*H10B 61/00* (2023.01)
*H10D 30/67* (2025.01)
(Continued)

(52) U.S. Cl.
CPC ......... *H10B 61/22* (2023.02); *H10D 30/6757* (2025.01); *H10D 62/121* (2025.01);
(Continued)

(58) Field of Classification Search
CPC ..... H10B 61/22; H10B 63/34; H01L 23/5283; H10D 30/6757; H10D 62/121;
(Continued)

(56) References Cited

U.S. PATENT DOCUMENTS 6,649,953 B2 11/2003 Cha
6,855,564 B2 2/2005 Cha
(Continued)

FOREIGN PATENT DOCUMENTS

CN 1385905 A 12/2002
CN 101847436 A 9/2010
(Continued)

OTHER PUBLICATIONS

International Search Report in the international application No. PCT/CN2021/120735, mailed on Dec. 30, 2021, 3 pages.
(Continued)

*Primary Examiner* — Duy T Nguyen
*Assistant Examiner* — Jiyoung Oh
(74) *Attorney, Agent, or Firm* — Syncoda LLC; Feng Ma

(57) ABSTRACT

Semiconductor structure and forming method therefor are provided. The semiconductor structure includes: substrate; first vertical transistor, including first source, first channel region located on the first source, first drain located on the first channel region, and first gate dielectric layer and first gate surrounding the first channel region; first storage structure located on the first drain; second vertical transistor, including the first source, second channel region located on the first source, second drain located on the second channel region, and second gate dielectric layer and second gate surrounding the second channel region; and second storage structure located on the second drain. The first source has bottom structure, first connection structure connecting the bottom structure, the first channel region and the second channel region, and second connection structure connecting the bottom structure and located on two sides of the first channel region and the second channel region.

15 Claims, 8 Drawing Sheets

(51) Int. Cl.

| | |
|---|---|
| ***H10D 62/10*** | (2025.01) |
| ***H10N 50/01*** | (2023.01) |
| ***H10N 50/10*** | (2023.01) |
| ***H10W 20/41*** | (2026.01) |

(52) U.S. Cl.
CPC ............. *H10N 50/01* (2023.02); *H10N 50/10* (2023.02); *H10W 20/435* (2026.01)

(58) Field of Classification Search
CPC .. H10D 30/6728; H10D 30/025; H10D 30/63; H10N 50/01; H10N 50/10
USPC .......................................................... 257/421
See application file for complete search history.

(56) References Cited

U.S. PATENT DOCUMENTS

| | | | | |
|---|---|---|---|---|
| 8,541,826 | B2 | 9/2013 | Pan | |
| 8,890,110 | B2 | 11/2014 | Park | |
| 9,721,957 | B2 | 8/2017 | Nakanishi | |
| 9,997,523 | B2 | 6/2018 | Nakanishi | |
| 10,083,971 | B1 * | 9/2018 | Zang | H10D 84/038 |
| 10,109,637 | B1 * | 10/2018 | Zang | H10B 10/12 |
| 10,566,236 | B2 | 2/2020 | Boemmels | |
| 2002/0140016 | A1 | 10/2002 | Cha | |
| 2003/0117865 | A1 * | 6/2003 | Hofmann | H10B 12/053 257/E29.112 |
| 2004/0061156 | A1 | 4/2004 | Cha | |
| 2013/0161730 | A1 | 6/2013 | Pan | |
| 2015/0069500 | A1 * | 3/2015 | Su | H10D 30/63 257/329 |
| 2015/0179655 | A1 | 6/2015 | Nakanishi et al. | |
| 2017/0294441 | A1 | 10/2017 | Nakanishi et al. | |
| 2019/0097010 | A1 | 3/2019 | Wang et al. | |
| 2019/0348540 | A1 | 11/2019 | Pillarisetty et al. | |
| 2019/0355726 | A1 * | 11/2019 | Pillarisetty | H10B 12/36 |
| 2020/0357795 | A1 * | 11/2020 | Zhu | H01L 21/3065 |

FOREIGN PATENT DOCUMENTS

| | | | | | |
|---|---|---|---|---|---|
| CN | 101911286 | A | | 12/2010 | |
| CN | 102522407 | A | | 6/2012 | |
| CN | 101847436 | B | * | 9/2012 | G11C 11/1659 |
| CN | 108110059 | A | | 6/2018 | |
| CN | 108198815 | A | | 6/2018 | |
| CN | 110024133 | A | | 7/2019 | |
| CN | 209658176 | U | * | 11/2019 | |
| CN | 112349322 | A | | 2/2021 | |
| CN | 113053943 | A | | 6/2021 | |
| EP | 2239772 | A1 | * | 10/2010 | H10B 10/12 |
| WO | WO-2013091374 | A1 | * | 6/2013 | H10B 12/053 |

OTHER PUBLICATIONS

First Office Action of the Chinese application No. 202110289188.6, issued on Jun. 2, 2022, 20 pages.

* cited by examiner

SEMICONDUCTOR STRUCTURE WITH VERTICAL TRANSISTOR AND FORMING METHOD THEREFOR

CROSS-REFERENCE TO RELATED APPLICATIONS

This is a continuation of International Patent Application No. PCT/CN2021/120735, filed on Sep. 26, 2021, which claims priority to Chinese patent application No. 202110289188.6, filed on Mar. 18, 2021. The disclosures of International Patent Application No. PCT/CN2021/120735 and Chinese patent application No. 202110289188.6 are hereby incorporated by reference in their entireties.

BACKGROUND

A Magnetic Random Access Memory (MRAM) is a non-volatile memory based on the integration of a silicon-based Complementary Oxide Semiconductor (CMOS) technology and a Magnetic Tunneling Junction (MTJ) technology. The MRAM combines a high-speed read and write capability of a Static Random Access Memory (SRAM) and a high level of integration of a Dynamic Random Access Memory (DRAM). The MTJ usually includes a fixed layer, a tunneling layer and a free layer. During a normal operation of the MRAM, a magnetization direction of the free layer may be changed, while a magnetization direction of the fixed layer remains unchanged. A resistance of the MRAM is related to the relative magnetization direction of the free layer and the fixed layer. When the magnetization direction of the free layer changes relative to the magnetization direction of the fixed layer, the resistance value of the MRAM changes accordingly, corresponding to different stored information.

SUMMARY

The present disclosure relates to the field of semiconductor manufacturing technology, in particular to a semiconductor structure and a method for forming a semiconductor structure.

The first aspect of embodiments of the present disclosure provides a semiconductor structure, which includes: a substrate, a first vertical transistor, a first storage structure, a second vertical transistor, and a second storage structure.

The first vertical transistor includes a first source electrode located in the substrate, a first channel region located in the substrate and on the first source electrode, a first drain electrode located on the first channel region, and a first gate dielectric layer and a first gate electrode surrounding the first channel region.

The first storage structure is located on the first drain electrode.

The second vertical transistor includes the first source electrode located in the substrate, a second channel region located in the substrate and on the first source electrode, a second drain electrode located on the second channel region, and a second gate dielectric layer and a second gate electrode surrounding the second channel region.

The second storage structure is located on the second drain electrode.

The first source electrode has a bottom structure, a first connection structure connecting the bottom structure, the first channel region and the second channel region, and a second connection structure connecting the bottom structure and located on two sides of the first channel region and the second channel region.

The second aspect of the embodiments of the present disclosure further provides a method for forming a semiconductor structure, which includes the following operations.

A substrate is provided.

A first vertical transistor and a second vertical transistor are formed. The first vertical transistor includes a first source electrode located in the substrate, a first channel region located in the substrate and on the first source electrode, a first drain electrode located on the first channel region, and a first gate dielectric layer and a first gate electrode surrounding the first channel region. The second vertical transistor includes the first source electrode located in the substrate, a second channel region located in the substrate and on the first source electrode, a second drain electrode located on the second channel region, and a second gate dielectric layer and a second gate electrode surrounding the second channel region. The first source electrode has a bottom structure, a first connection structure connecting the bottom structure, the first channel region and the second channel region, and a second connection structure connecting the bottom structure and located on two sides of the first channel region and the second channel region.

A first storage structure is formed on the first drain electrode, and a second storage structure is formed on the second drain electrode.

DETAILED DESCRIPTION

The existing MRAM has poor electrical performance. Therefore, embodiments of the present disclosure provide a semiconductor structure and a method for forming a semiconductor structure, which are helpful to improve the problem of poor electrical performance of the existing memory.

Some embodiments of the present disclosure provide a semiconductor structure, which includes: a substrate, a first vertical transistor, a first storage structure, a second vertical transistor, and a second storage structure. The first vertical transistor includes a first source electrode located in the substrate, a first channel region located in the substrate and on the first source electrode, a first drain electrode located on the first channel region, and a first gate dielectric layer and a first gate electrode surrounding the first channel region. The first storage structure is located on the first drain electrode. The second vertical transistor includes the first source electrode located in the substrate, a second channel region located in the substrate and on the first source electrode, a second drain electrode located on the second channel region, and a second gate dielectric layer and a second gate electrode surrounding the second channel region. The second storage structure is located on the second drain electrode. The first source electrode has a bottom structure, a first connection structure connecting the bottom structure, the first channel region and the second channel region, and a second connection structure connecting the bottom structure and located on two sides of the first channel region and the second channel region. In some embodiments of the present disclosure, the first vertical transistor and the second vertical transistor which share the first source electrode are formed in an active area of the semiconductor structure, and the first source electrode has the bottom structure, the first connection structure connecting the bottom structure, the first channel region and the second channel region, and the second connection structure connecting the bottom structure and located on two sides of the first channel region and the second channel region, which not only helps to reduce a resistance in the semiconductor structure and increase a conduction current in the semiconductor structure, but also has a simple manufacturing process, thus improving the electrical performance of the semiconductor structure and improving the yield of the semiconductor structure.

A specific implementation of the semiconductor structure and forming method therefor provided in some embodiments of the present disclosure is described in detail below in combination with the accompanying drawings.

Figure 1:
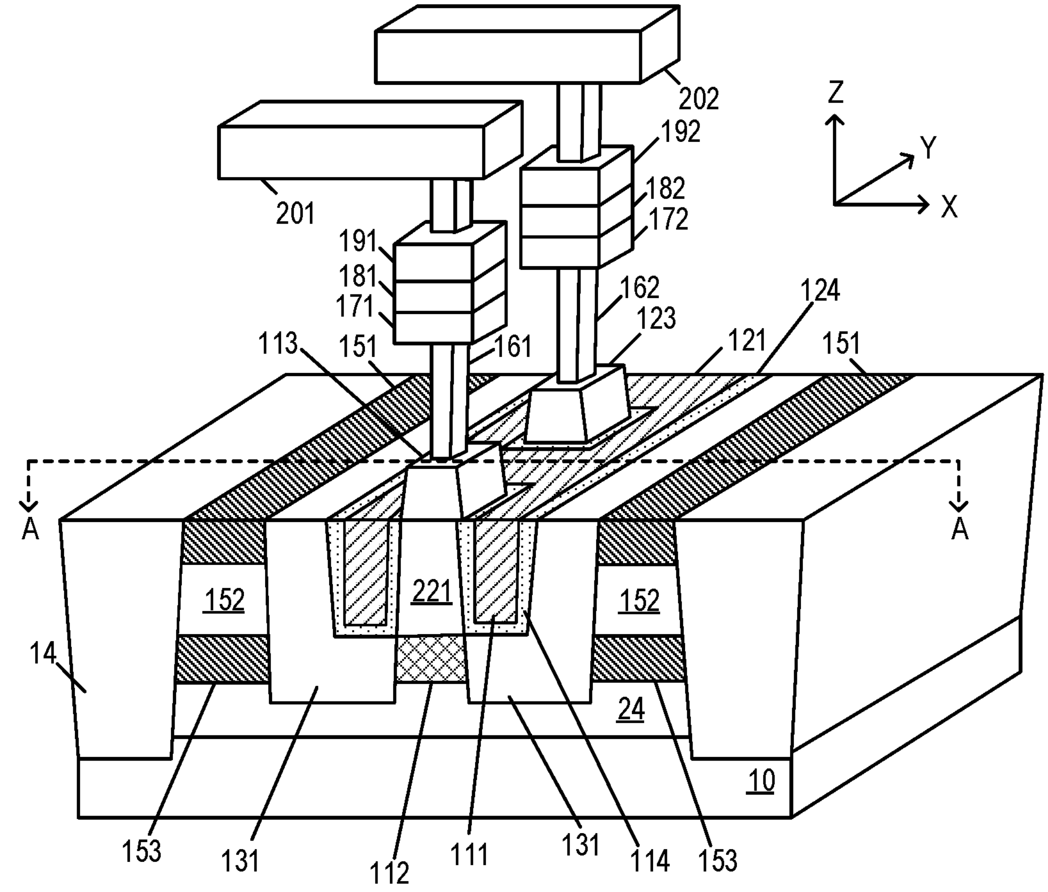
FIG. 1 is a schematic diagram of a semiconductor structure according to an embodiment of the present disclosure.
Figure 2:
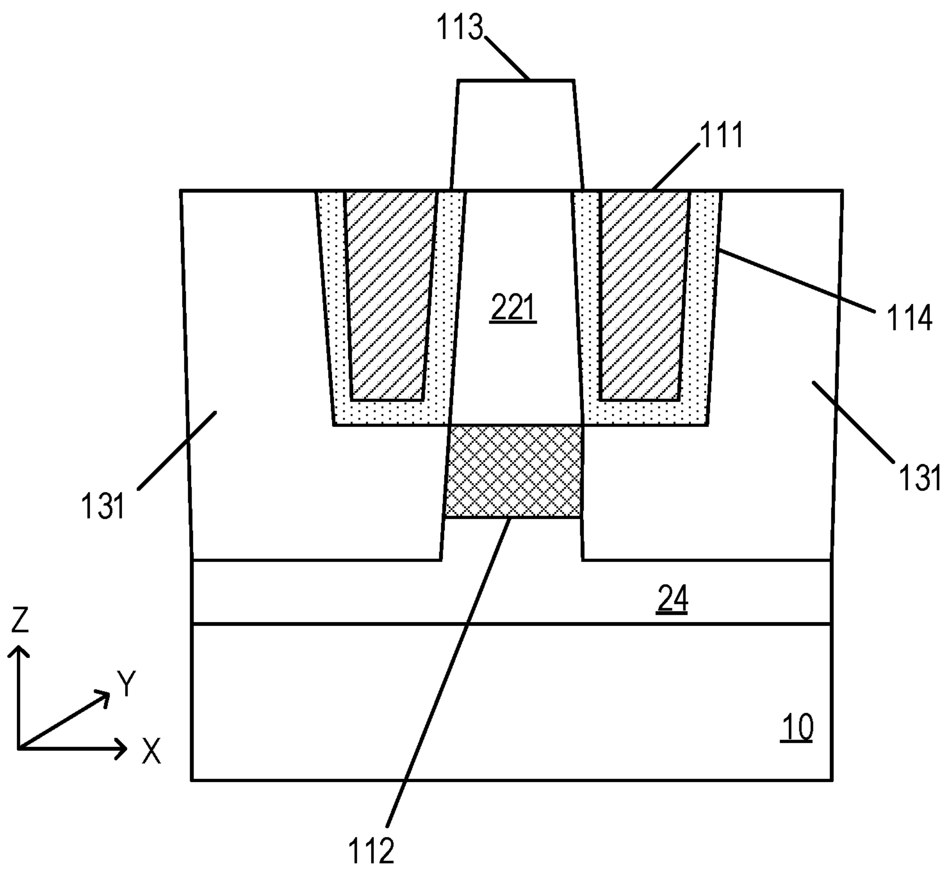
FIG. 2 is a partial section view of FIG. 1 along a direction of AA line.

An embodiment provides a semiconductor structure. FIG. 1 is a schematic diagram of a semiconductor structure according to an embodiment of the present disclosure. FIG. 2 is a partial section view of FIG. 1 along the direction of AA line. As shown in FIG. 1 and FIG. 2, the semiconductor structure provided in the embodiment includes: a substrate 10, a first vertical transistor, a first storage structure, a second vertical transistor, and a second storage structure.

The first vertical transistor includes a first source electrode located in the substrate 10, a first channel region 221 located in the substrate 10 and on the first source electrode, a first drain electrode 113 located on the first channel region 221, and a first gate dielectric layer 114 and a first gate electrode 111 surrounding the first channel region 221.

The first storage structure is located on the first drain electrode 113.

The second vertical transistor includes the first source electrode located in the substrate 10, a second channel region located in the substrate 10 and on the first source electrode, a second drain electrode 123 located on the second channel region, and a second gate dielectric layer 124 and a second gate electrode 121 surrounding the second channel region.

The second storage structure is located on the second drain electrode 123.

The first source electrode has a bottom structure 24, a first connection structure 112 connecting the bottom structure, the first channel region 221 and the second channel region, and a second connection structure connecting the bottom structure and located on two sides of the first channel region 221 and the second channel region.

Exemplarily, as shown in FIG. 1, the substrate 10 may be, but is not limited to, a silicon substrate. The embodiment is illustrated by taking the silicon substrate as an example. In other examples, the substrate 10 may be a semiconductor substrate such as a gallium nitride, gallium arsenide, gallium carbide, silicon carbide or Silicon-On-Insulator (SOI). The substrate 10 has a plurality of active areas arranged in an array, and the adjacent active regions are isolated from each other by a shallow trench isolation structure 14. There are at least two vertical transistors in each active area, that is, the first vertical transistor and the second vertical transistor are located in the same active area. Those skilled in the art may also arrange three or more than three vertical transistors in one active area according to actual needs. In the first vertical transistor, the first source electrode, the first channel region 221, and the first drain electrode 113 are stacked sequentially along a direction perpendicular to the substrate 10. In the second vertical transistor, the first source electrode, the second channel region, and the second drain electrode 123 are also stacked sequentially along the direction perpendicular to the substrate 10. The first vertical transistor and the second vertical transistor are arranged along a direction parallel to a surface of the substrate 10, for example, arranged in parallel along the Y-axis direction in FIG. 1 and FIG. 2.

The first gate dielectric layer 114 surrounding the first channel region 221 means that a projection of the first channel region 221 in the direction perpendicular to the substrate 10 (for example, the z-axis direction in FIG. 1) is surrounded by the first gate dielectric layer 114. The first gate electrode 111 is located on the first gate dielectric layer 114, and the first gate electrode 111 is also arranged around the first channel region 221. The second gate dielectric layer 124 surrounding the second channel region means that a projection of the second channel region in the direction perpendicular to the substrate 10 (for example, the z-axis direction in FIG. 1) is surrounded by the second gate dielectric layer 124. The second gate electrode 121 is located on the second gate dielectric layer 124, and the second gate electrode 121 is also arranged around the second channel region.

In order to further reduce the size of the semiconductor structure, in some embodiments, both the first channel region 221 and the second channel region are nanowire channel regions. That is, both the first channel region 221 and the second channel region are manufactured by a nanowire process.

In some embodiments, the first vertical transistor and the second vertical transistor share the gate dielectric layer and the gate electrode.

Exemplarily, as shown in FIG. 1, both the first gate electrode 111 and the second gate electrode 121 are located in the substrate 10, which helps to reduce the size of the semiconductor structure and improve the level of integration of the semiconductor structure. The first vertical transistor and the second vertical transistor sharing the gate dielectric layer and the gate electrode means that the first gate dielectric layer 114 in the first vertical transistor and the second gate dielectric layer 124 in the second vertical transistor are in direct contact with each other and form an integrated structure, and the first gate electrode 111 in the first vertical transistor and the second gate electrode 121 in the second vertical transistor are in direct contact with each other and form an integrated structure. The first vertical transistor and the second vertical transistor share the gate dielectric layer and the gate electrode, which not only enables a miniaturization of the semiconductor structure, but also helps to simplify the steps involved in manufacturing the semiconductor structure.

In some embodiments, the first storage structure is an MTJ structure, a capacitive storage structure, a resistive storage structure, a phase change storage structure or a ferroelectric storage structure.

For example, the first storage structure is the MTJ structure. As shown in FIG. 1, the first storage structure includes a first plug 161 on the first drain electrode 113, a first bottom electrode 171 on the first plug 161, a first MTJ layer 181 on the first bottom electrode 171, and a first top electrode 191 on the first MTJ layer 181. The bottom end of the first MTJ layer 181 is electrically connected to the first bottom electrode 171, the top end of the first MTJ layer 181 is electrically connected to the first top electrode 191, the first bottom electrode 171 is electrically connected to the first drain electrode 113 of the first vertical transistor through the first plug 161, and the first top electrode 191 is electrically connected to a first bit line 201 through a third plug.

In some embodiments, the second storage structure is the MTJ structure, the capacitive storage structure, the resistive storage structure, the phase change storage structure or the ferroelectric storage structure.

For example, the second storage structure is the MTJ structure. As shown in FIG. 1, the second storage structure includes a second plug 162 on the second drain electrode 123, a second bottom electrode 172 on the second plug 162, a second MTJ layer 182 on the second bottom electrode 172, and a second top electrode 192 on the second MTJ layer 182. The bottom end of the second MTJ layer 182 is electrically connected to the second bottom electrode 172, the top end of the second MTJ layer 182 is electrically connected to the second top electrode 192, the second bottom electrode 172 is electrically connected to the second drain electrode 123 of the second vertical transistor through the second plug 162, and the second top electrode 192 is electrically connected to a second bit line 202 through a fourth plug.

In the embodiment, the first vertical transistor and the second vertical transistor are formed in one active area, the first vertical transistor is electrically connected to the first bit line 201 through the first storage structure with the first MTJ layer 181, and the second vertical transistor is electrically connected to the second bit line 202 through the second storage structure with the second MTJ layer 182, which helps to reduce the bit line resistance in the MRAM, thus increasing a drive current of the MRAM and improving a response speed of the MRAM.

In some embodiments, the semiconductor structure may further include: a first trench located in the substrate 10 and surrounding the first channel region 221 and the second channel region; an isolation layer 131 filling the first trench; a second trench located in the isolation layer 131 and surrounding the first channel region 221 and the second channel region; a gate dielectric layer located on an inner wall of the second trench; and a gate electrode layer filling the second trench.

In some embodiments, a bottom surface of the first trench is lower than a bottom surface of the first connection structure 112 and extends into the bottom structure 24.

In order to ensure a control performance of the gate electrode, in some embodiments, a bottom surface of the second trench is flush with bottom surfaces of the first channel region 221 and the second channel region.

Exemplarily, the first trench surrounding the first channel region 221 and the second channel region can be formed by etching the substrate 10, and the isolation layer 131 is formed in the first trench by filling the first trench. As shown in FIG. 1 and FIG. 2, the isolation layer 131 is located between the second connection structure and the first channel region 221 (or the second channel region), and is configured to isolate the second connection structure from the first channel region 221 (or the second channel region), so that a parasitic effect in the substrate 10 can be reduced. The first trench and the shallow trench isolation structure 14 may be formed synchronously, thus simplifying the steps involved in manufacturing the semiconductor structure. The second trench is located on the side, close to the first channel region 221 and the second channel region, of the isolation layer 131. A gate dielectric layer (including the first gate dielectric layer 114 and the second gate dielectric layer 124) covers the inner wall of the second trench, and a gate electrode layer (including the first gate electrode 111 and the second gate electrode 121) covers the surface of the gate dielectric layer and fills the second trench. A material of the gate dielectric layer may be, but is not limited to, an oxide material, such as silicon dioxide. A material of the gate electrode layer may be, but is not limited to, a conductive metal material, such as tungsten.

In the embodiment, the bottom surface of the first trench is arranged to be lower than the bottom surface of the first connection structure 112 and to extend into the bottom structure 24, the parasitic capacitance in the substrate 10 can be reduced effectively and the electrical performance of the semiconductor structure can be improved.

In some embodiments, the second connection structure includes a first doped layer 153 on the bottom structure 24, a second doped layer 152 on the first doped layer 153, and a third doped layer 151 on the second doped layer 152.

In some embodiments, the first doped layer 153, the second doped layer 152 and the third doped layer 151 have the same doping type.

In some embodiments, a doping concentration of the second doped layer 152 is lower than that of the first doped layer 153 and the third doped layer 151.

For example, the bottom structure 24 is an n-type ion doped Deep N-Well (DNW). The first connection structure 112 is doped with n-type ions. The type of doping ions in the first doped layer 153, the second doped layer 152 and the third doped layer in the second connection structure is the same as that of the first connection structure, namely n-type doping ions. The second doped layer 152 is lightly doped with n-type ions. The first channel region 221 and the second channel region are doped with p-type ions. The first drain electrode 113 and the second drain electrode 123 are doped with n-type ions. The second connection structure includes the first doped layer 153, the second doped layer 152, and the third doped layer 151 stacked sequentially along the direction perpendicular to the substrate 10, which can match the process of forming the first channel region 221 and the second channel region, thus simplifying the steps involved in manufacturing the semiconductor structure.

Figure 3:
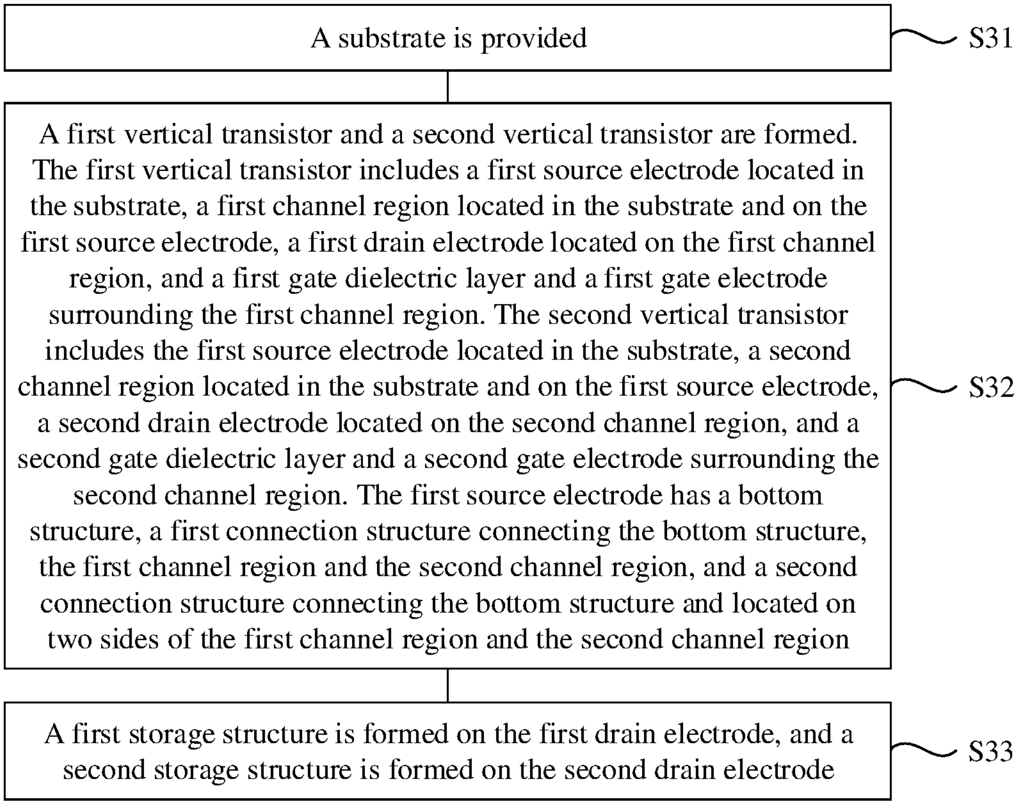
FIG. 3 is a flowchart of a method for forming a semiconductor structure according to another embodiment of the present disclosure.

Moreover, an embodiment further provides a method for forming a semiconductor structure. FIG. 3 is a flowchart of a method for forming a semiconductor structure according to another embodiment of the present disclosure. FIG. 4A to FIG. 4I are schematic diagrams of the main process structure in a process of forming a semiconductor structure according to another embodiment of the present disclosure. The schematic diagram of the semiconductor structure formed in the embodiment can be referred to FIG. 1 and FIG. 2. As shown in FIG. 1 to FIG. 3, and FIG. 4A to FIG. 4I, the method for forming a semiconductor structure provided by the embodiment includes the following operations.

At S31, a substrate 10 is provided.

At S32, a first vertical transistor and a second vertical transistor are formed. The first vertical transistor includes a first source electrode located in the substrate 10, a first channel region 221 located in the substrate 10 and on the first source electrode, a first drain electrode 113 located on the first channel region 221, and a first gate dielectric layer 114 and a first gate electrode 111 surrounding the first channel region 221. The second vertical transistor includes the first source electrode located in the substrate 10, a second channel region located in the substrate 10 and on the first source electrode, a second drain electrode 123 located on the second channel region, and a second gate dielectric layer 124 and a second gate electrode 121 surrounding the second channel region. The first source electrode has a bottom structure 24, a first connection structure 112 connecting the bottom structure 24, the first channel region 221 and the second channel region, and a second connection structure connecting the bottom structure 24 and located on two sides of the first channel region 221 and the second channel region.

At S33, a first storage structure is formed on the first drain electrode 113, and a second storage structure is formed on the second drain electrode 123.

In some embodiments, the first storage structure is the MTJ structure, the capacitive storage structure, the resistive storage structure, the phase change storage structure or the ferroelectric storage structure.

In some embodiments, the second storage structure is the MTJ structure, the capacitive storage structure, the resistive storage structure, the phase change storage structure or the ferroelectric storage structure.

In some embodiments, the operation that the first storage structure is formed on the first drain electrode 113 may include the following operations.

A first plug 161 is formed on the first drain electrode 113.

A first bottom electrode 171 is formed on the first plug 161.

A first MTJ layer 181 is formed on the first bottom electrode 171.

A first top electrode 191 is formed on the first MTJ layer 181.

In some embodiments, the operation that the second storage structure is formed on the second drain electrode may include the following operations.

A second plug 162 is formed on the second drain electrode 123.

A second bottom electrode 172 is formed on the second plug 162.

A second MTJ layer 182 is formed on the second bottom electrode 172.

A second top electrode 192 is formed on the second MTJ layer 182.

Figure 4A:
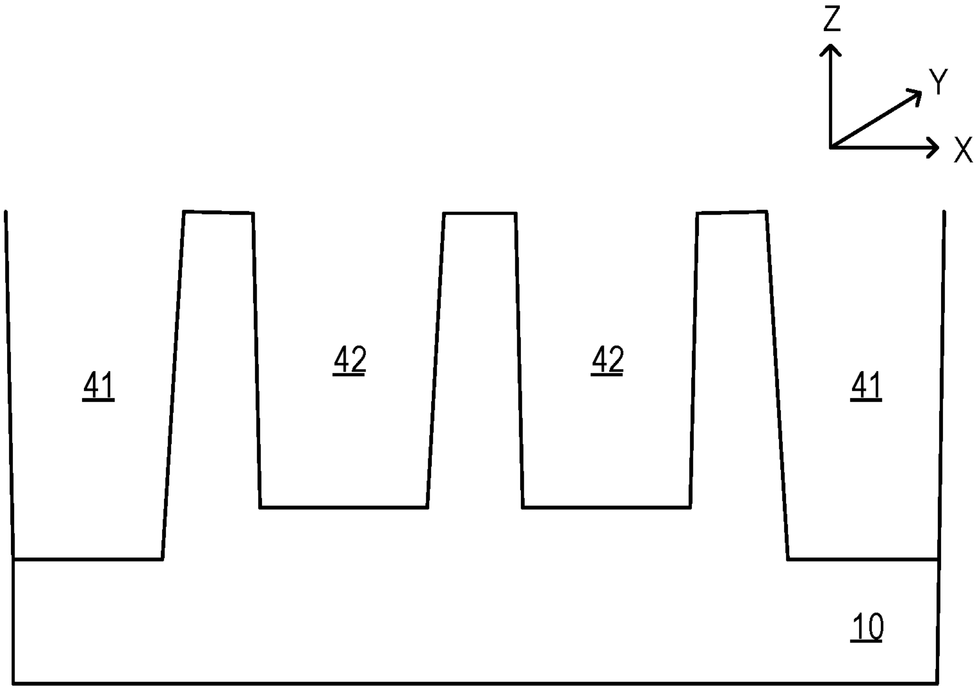
FIG. 4A to FIG. 4I are schematic diagrams of the main process structure in a process of forming a semiconductor structure according to another embodiment of the present disclosure.
Figure 4B:
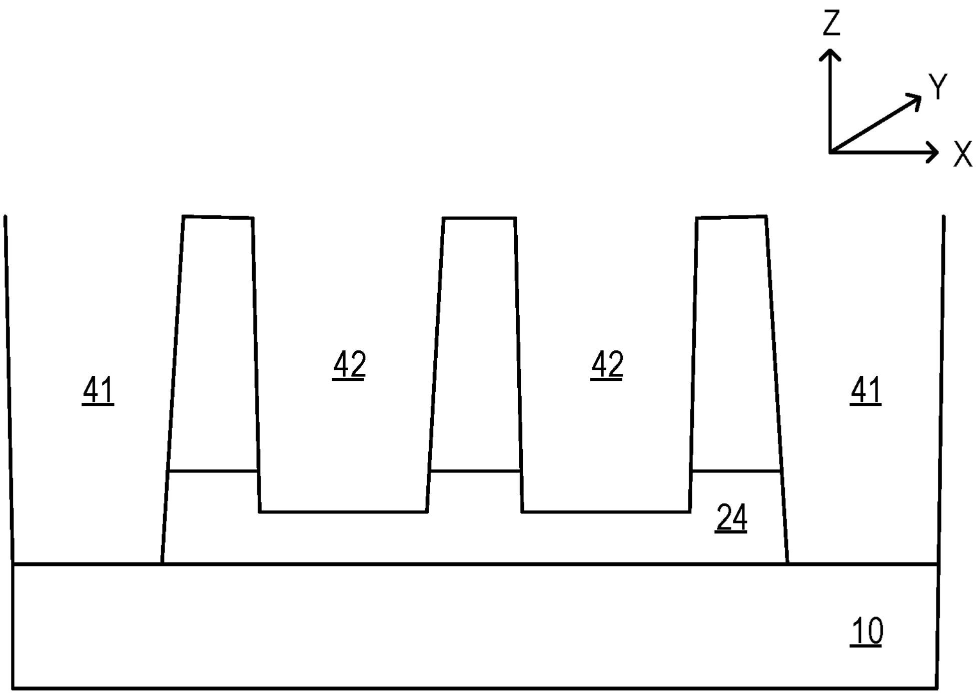
Figure 4C:
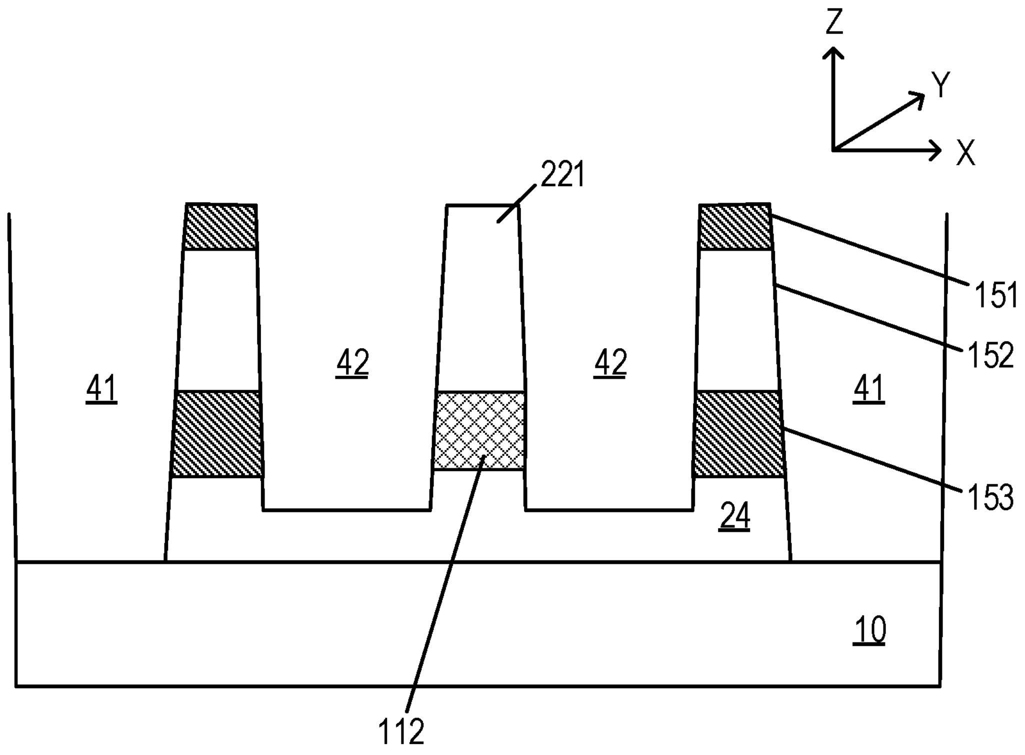
Figure 4D:
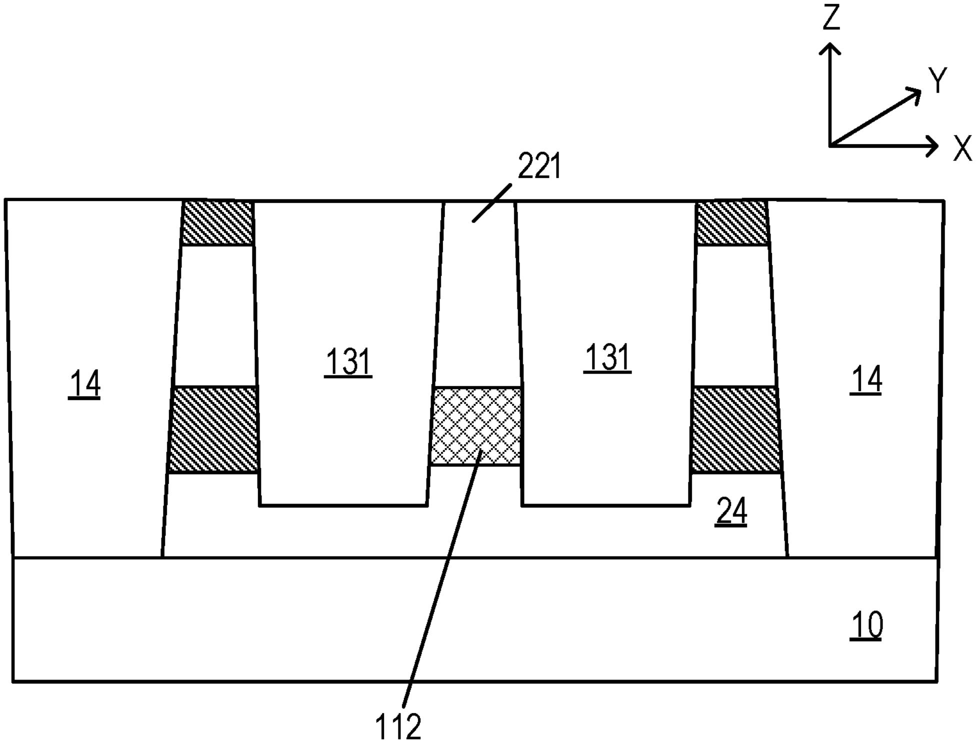
Figure 4E:
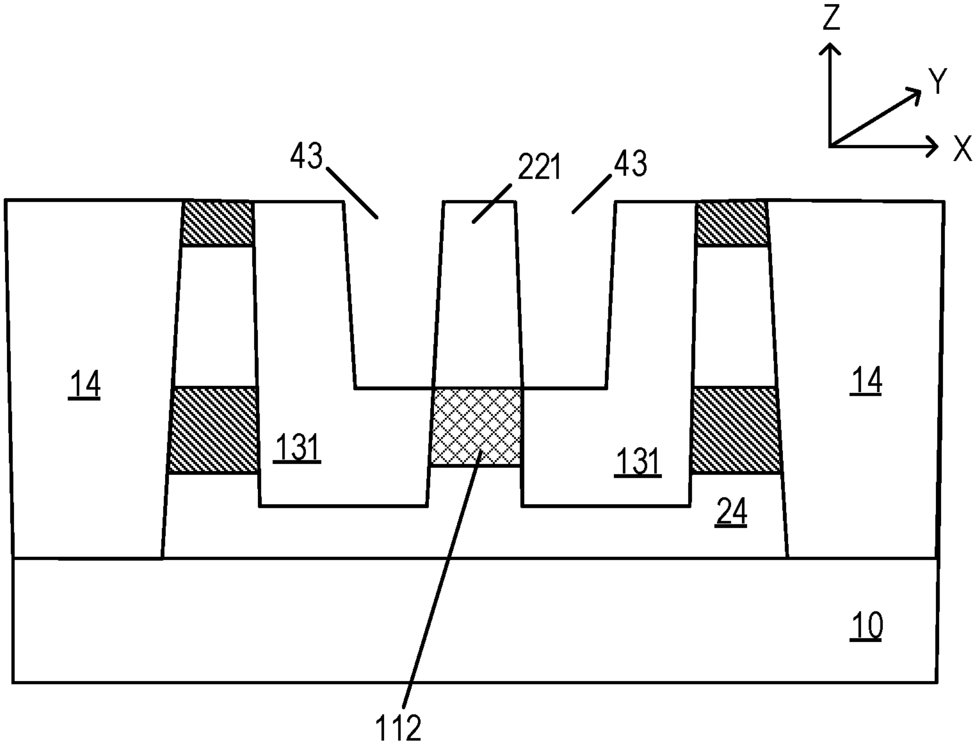
Figure 4F:
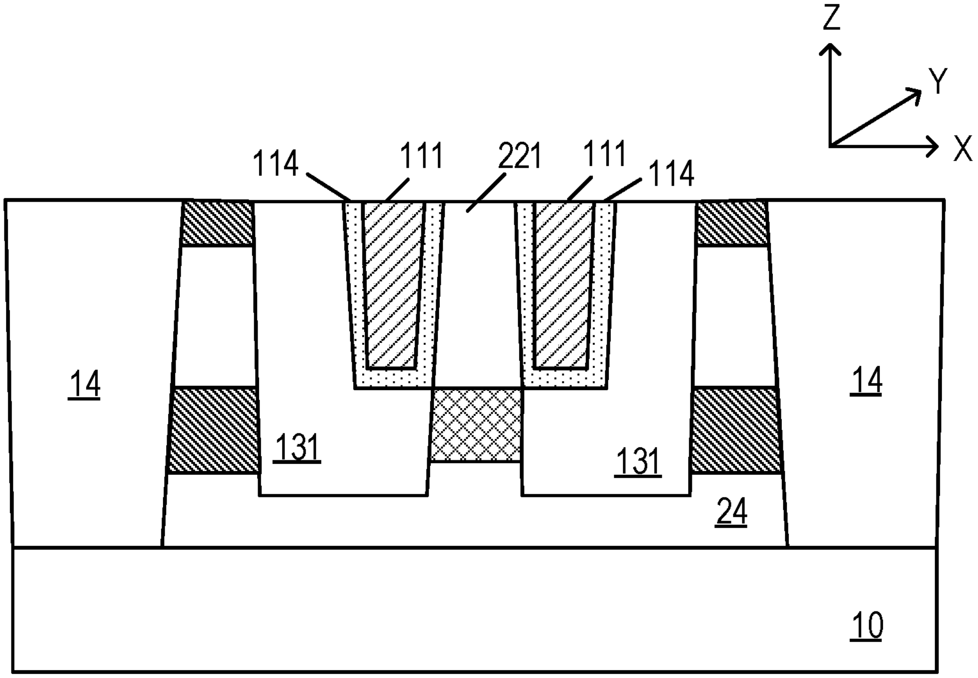
Figure 4G:
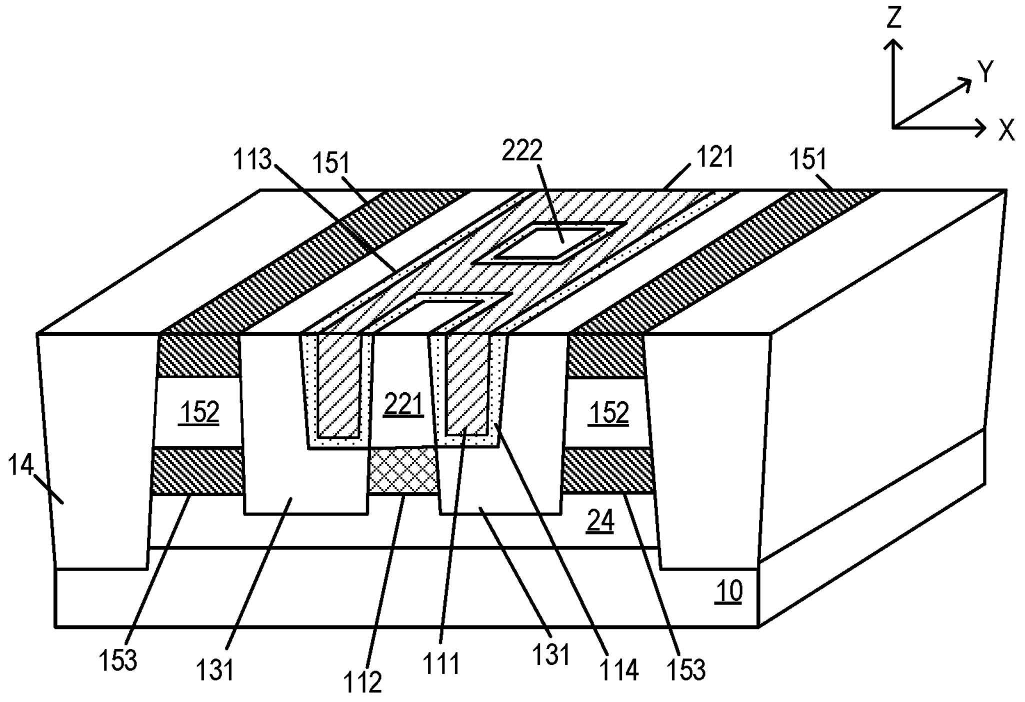
Figure 4H:
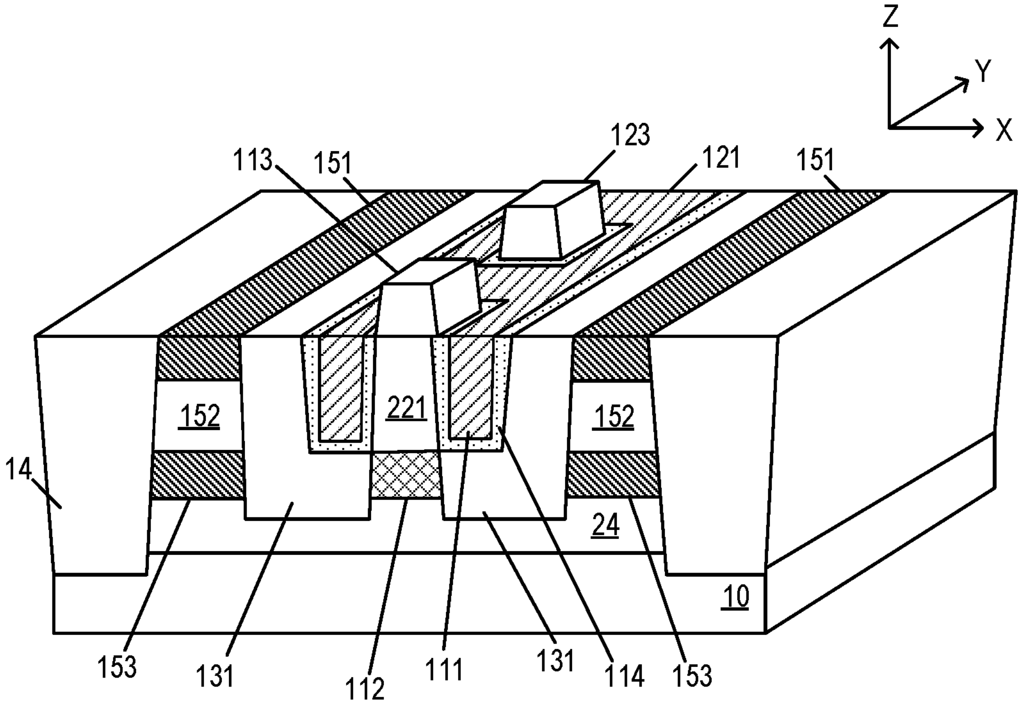
Figure 4I:
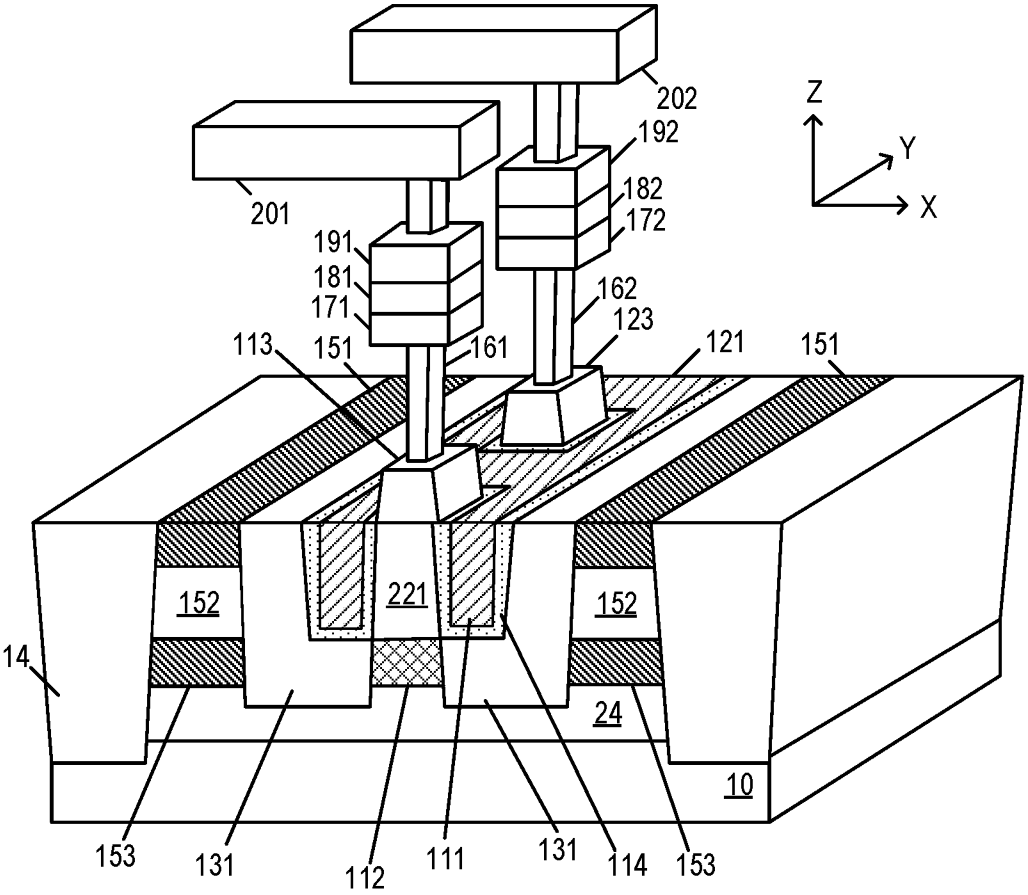

As shown in FIG. 4I, a bottom end of the first MTJ layer 181 is electrically connected to the first bottom electrode 171, a top end of the first MTJ layer 181 is electrically connected to the first top electrode 191, the first bottom electrode 171 is electrically connected to the first drain electrode 113 of the first vertical transistor through the first plug 161, and the first top electrode 191 is electrically connected to a first bit line 201 through a third plug. A bottom end of the second MTJ layer 182 is electrically connected to the second bottom electrode 172, a top end of the second MTJ layer 182 is electrically connected to the second top electrode 192, the second bottom electrode 172 is electrically connected to the second drain electrode 123 of the second vertical transistor through the second plug 162, and the second top electrode 192 is electrically connected to a second bit line 202 through a fourth plug. The first storage structure and the second storage structure may be formed synchronously to simplify the steps in the manufacturing process.

In some embodiments, the operation that the first vertical transistor and the second vertical transistor are formed may further include the following operations.

The substrate 10 is etched, and a plurality of shallow trenches 41 and a first trench 42 located between two adjacent shallow trenches 41 are formed in the substrate 10. The first trench 42 is annular in shape.

The substrate 10 is doped to form a bottom structure 24 located between two adjacent shallow trenches 41, a first connection structure 112 located in an area surrounded by the first trench 42, a second connection structure located between the adjacent shallow trench 41 and the first trench 42, and a first channel region 221 and a second channel region located in the area surrounded by the first trench 42.

The first trench 42 and the shallow trench 41 are filled to form an isolation layer 131 in the first trench 42 and a shallow trench isolation structure 14 in the shallow trench 41.

A second trench 43 surrounding the first channel region 221 and the second channel region is formed in the isolation layer 131.

A dielectric material is deposited on an inner wall of the second trench 43 to form a gate dielectric layer on the inner wall of the second trench 43.

In some embodiments, the first vertical transistor and the second vertical transistor share the gate dielectric layer and the gate electrode. The operation that the substrate 10 is doped may include the following operations.

The substrate 10 is doped with first-type ions with a first concentration to form the first connection structure 112 and a first doped layer 153 which is located on the bottom structure 24 and distributed on two sides of the first connection structure 112.

The substrate 10 on the first doped layer 153 is doped to form a second doped layer 152 on the first doped layer 153.

The substrate 10 on the second doped layer 152 is doped to form a third doped layer 151 on the second doped layer 152.

Exemplarily, in order to simplify the manufacturing process, a first trench 42 may be formed in the active area while the substrate 10 is etched to form a shallow trench 41 for isolating the adjacent active areas, as shown in FIG. 4A. The first trench 42 may be formed before the first source electrode, the first channel region 221, the second channel region, the first drain electrode 113 and the second drain electrode 123 are formed. In this case, the substrate 10 may be etched according to a layout design, so that the formed first trench 42 surrounds an area, where the first channel region 221 and the second channel region will be formed, in the substrate 10. After the first trench 42 and the shallow trench 41 are formed, the substrate 10 is doped with the first-type ions (for example, n-type ions) to form the bottom structure 24, as shown in FIG. 4B. After that, the substrate 10 on the bottom structure 24 is doped with the first-type ions again, so as to form the first connection structure 112 and the first doped layer 153, that is, the ion-type, the doping concentration and a doping depth of the first connection structure 112 may be the same as that of the first doped layer 153. After that, the substrate 10 on the first doped layer 153 is doped with the first-type ions to form the second doped layer 152. The substrate 10 on the second doped layer 152 is doped with the first-type ions to form the third doped layer 151. The substrate 10 in the area surrounded by the first trench 42 and on the first connection structure 112 is doped with the second-type ions (for example, p-type ions), so as to form the first channel region 221 and the second channel region, and then the structure shown in FIG. 4C is obtained.

In some embodiments, the second doped layer 152 and the bottom structure 24 may be formed in the same doping step, that is, the doped ion-type and the doping concentration of the second doped layer 152 may be the same as that of the bottom structure 24, so as to simplify the manufacturing process.

In some embodiments, the third doped layer 151, the first drain electrode 113 and the second drain electrode 123 may be formed in the same doping step, that is, the doped ion-type, the doping concentration and the doping depth of the third doped layer 151 may be the same as that of the first drain electrode 113 and the second drain electrode 123, so as to simplify the manufacturing process.

After that, the shallow trench 41 and the first trench 42 are filled with an insulating material, and the shallow trench isolation structure 14 and the isolation layer 131 are formed, as shown in FIG. 4D. Next, the first trench 42 is etched at one side toward the first channel region 221 and the second channel region, to form a second trench 43 surrounding the first channel region 221 and the second channel region, as shown in FIG. 4E. A dielectric material is deposited on the inner wall of the second trench 43 to form a gate dielectric layer. A conductive material which covers the gate dielectric layer and fills the second trench 43 is deposited to form a gate electrode, as shown in FIG. 4F and FIG. 4G. The first vertical transistor and the second vertical transistor share the gate dielectric layer and the gate electrode. A part of the gate dielectric layer surrounding the first channel region 221 is used as the first gate dielectric layer 114, and a part surrounding the second channel region is used as the second gate dielectric layer 124. A part of the gate electrode surrounding the first channel region 221 is used as the first gate electrode 111, and the part surrounding the second channel region is used as the second gate electrode 121. Finally, a first drain electrode 113 is formed on the substrate 10 at a position corresponding to the first channel region 221, and a second drain electrode 123 is formed on the substrate 10 at a position corresponding to the second channel region, as shown in FIG. 4H. Specifically, the first drain electrode 113 and the second drain electrode 123 may be formed on the first channel region 221 and the second channel region respectively by an epitaxy growth technology.

By forming the isolation layer 131 in the embodiment, on the one hand, the parasitic effect in the substrate 10 can be reduced, and on the other hand, it is convenient to adjust the size of the second trench 43 in the isolation layer 131, thus reducing the difficulty of the manufacturing process.

Those skilled in the art may also etch the substrate 10 to form the first trench 42 after the first source electrode, the first channel region 221 and the second channel region have been formed according to actual needs.

In order to reduce the parasitic effect, in some embodiments, the bottom surface of the first trench 42 is lower than the bottom surface of the first connection structure 112 and extends into the bottom structure 24.

In order to ensure the control performance of the gate electrode, in some embodiments, the bottom surface of the second trench 43 is flush with the bottom surfaces of the first channel region 221 and the second channel region.

In some embodiments, the first doped layer 153, the second doped layer 152 and the third doped layer 151 have the same doping type.

In some embodiments, the doping concentration of the second doped layer 152 is lower than that of the first doped layer 153 and the third doped layer 151.

In order to further reduce the size of the semiconductor structure, in some embodiments, the operation that the first channel region 221 and the second channel region which are located on the first connection structure 112 and distributed between two second connection structures are formed may include the following operation.

The first channel region 221 and the second channel region are formed by the nanowire process.

In the semiconductor structure and the method for forming the semiconductor structure provided by the embodiments, the first vertical transistor and the second vertical transistor which share the first source electrode are formed in one active area of the semiconductor structure, and the first source electrode has the bottom structure, the first connection structure connecting the bottom structure, the first channel region and the second channel region, and the second connection structure connecting the bottom structure and located on two sides of the first channel region and the second channel region, which not only helps to reduce the resistance in the semiconductor structure, reduce the size of the semiconductor structure and increase the conduction current in the semiconductor structure, but also has a simple manufacturing process, thus improving the electrical performance of the semiconductor structure and improving the yield of the semiconductor structure.

It should be understood that, the above embodiments of the present disclosure are used only to exemplify or explain the principle of the present disclosure and do not intend to limit the present disclosure. Therefore, any modifications, equivalent replacements, improvements and the like made without deviating from the spirit and scope of the present disclosure should fall within the scope of protection of the present disclosure. In addition, the appended claims are intended to cover all variations and modifications falling within the scope and boundary or equivalents of the scope and boundary of the claims.

The invention claimed is:

1. A semiconductor structure, comprising:

a substrate;

a first vertical transistor, comprising: a first source electrode located in the substrate, a first channel region located in the substrate and on the first source electrode, a first drain electrode located on the first channel region, and a first gate dielectric layer and a first gate electrode surrounding the first channel region;

a first storage structure located on the first drain electrode;

a second vertical transistor, comprising: the first source electrode located in the substrate, a second channel region located in the substrate and on the first source electrode, a second drain electrode located on the second channel region, and a second gate dielectric layer and a second gate electrode surrounding the second channel region; and a second storage structure located on the second drain electrode;

wherein the first source electrode has a bottom structure, a first connection structure connecting the bottom structure, the first channel region and the second channel region, and a pair of second connection structures connecting the bottom structure and located on opposite sides of the first channel region and the second channel region; wherein each of the pair of second connection structures comprises a first doped layer on the bottom structure, a second doped layer on the first doped layer, and a third doped layer on the second doped layer; and a doping concentration of the second doped layer is lower than that of the first doped layer and the third doped layer; and wherein, in a direction perpendicular to the substrate, a top surface of the second drain electrode is higher than a top surface of the third doped layer.

2. The semiconductor structure of claim 1, wherein the first vertical transistor and the second vertical transistor share a gate dielectric layer and a gate electrode.

3. The semiconductor structure of claim 1, wherein the first doped layer, the second doped layer and the third doped layer have same doping type.

4. The semiconductor structure of claim 1, wherein at least one of the following applies:

the first storage structure is a Magnetic Tunneling Junction (MTJ) structure, a capacitive storage structure, a resistive storage structure, a phase change storage structure or a ferroelectric storage structure; or the second storage structure is the MTJ structure, the capacitive storage structure, the resistive storage structure, the phase change storage structure or the ferroelectric storage structure.

5. The semiconductor structure of claim 1, wherein both the first channel region and the second channel region are nanowire channel regions.

6. The semiconductor structure of claim 1, further comprising:

a first trench, which is located in the substrate and surrounds the first channel region and the second channel region; an isolation layer filling the first trench; a second trench, which is located in the isolation layer and surrounds the first channel region and the second channel region; a gate dielectric layer located on an inner wall of the second trench; and a gate electrode layer filling the second trench.

7. The semiconductor structure of claim 6, wherein a bottom surface of the first trench is lower than that of the first connection structure and extends into the bottom structure.

8. The semiconductor structure of claim 6, wherein a bottom surface of the second trench is flush with bottom surfaces of the first channel region and the second channel region.

9. A method for forming a semiconductor structure, comprising:

providing a substrate;

forming a first vertical transistor and a second vertical transistor, wherein the first vertical transistor comprises a first source electrode located in the substrate, a first channel region located in the substrate and on the first source electrode, a first drain electrode located on the first channel region, and a first gate dielectric layer and a first gate electrode surrounding the first channel region; the second vertical transistor comprises the first source electrode located in the substrate, a second channel region located in the substrate and on the first source electrode, a second drain electrode located on the second channel region, and a second gate dielectric layer and a second gate electrode surrounding the second channel region; wherein the first source electrode has a bottom structure, a first connection structure connecting the bottom structure, the first channel region and the second channel region, and a pair of second connection structures connecting the bottom structure and located on two sides of the first channel region and the second channel region; and forming a first storage structure on the first drain electrode and a second storage structure on the second drain electrode; wherein each of the pair of second connection structures comprises a first doped layer on the bottom structure, a second doped layer on the first doped layer, and a third doped layer on the second doped layer; and a doping concentration of the second doped layer is lower than that of the first doped layer and the third doped layer; and wherein, in a direction perpendicular to the substrate, a top surface of the second drain electrode is higher than a top surface of the third doped layer.

10. The method for forming a semiconductor structure of claim 9, wherein at least one of the following applies:

the first storage structure is a Magnetic Tunneling Junction (MTJ) structure, a capacitive storage structure, a resistive storage structure, a phase change storage structure or a ferroelectric storage structure; or the second storage structure is the MTJ structure, the capacitive storage structure, the resistive storage structure, the phase change storage structure or the ferroelectric storage structure.

11. The method for forming a semiconductor structure of claim 10, wherein forming the first storage structure on the first drain electrode comprises:

forming a first plug on the first drain electrode;

forming a first bottom electrode on the first plug;

forming a first MTJ layer on the first bottom electrode; and forming a first top electrode on the first MTJ layer.

12. The method for forming a semiconductor structure of claim 9, wherein forming the first vertical transistor and the second vertical transistor comprises:

forming a plurality of shallow trenches and a first trench located between two adjacent shallow trenches in the substrate, the first trench being annular in shape;

doping the substrate to form the bottom structure located between two adjacent shallow trenches, the first connection structure located in an area surrounded by the first trench, each of the pair of second connection structures located between an adjacent shallow trench and the first trench, and the first channel region and the second channel region located in the area surrounded by the first trench;

filling the first trench and the plurality of shallow trenches to form an isolation layer in the first trench and a shallow trench isolation structure in each of the plurality of shallow trenches;

forming a second trench surrounding the first channel region and the second channel region in the isolation layer; and forming a gate dielectric layer on an inner wall of the second trench.

13. The method for forming a semiconductor structure of claim 12, wherein a bottom surface of the first trench is lower than that of the first connection structure and extends into the bottom structure.

14. The method for forming a semiconductor structure of claim 12, wherein the first vertical transistor and the second vertical transistor share the gate dielectric layer and a gate electrode;

doping the substrate comprises:

doping the substrate with first-type ions with a first concentration, to form the first connection structure and a first doped layer which is located on the bottom structure and distributed on two sides of the first connection structure;

doping the substrate on the first doped layer to form a second doped layer on the first doped layer; and doping the substrate on the second doped layer to form a third doped layer on the second doped layer.

15. The method for forming a semiconductor structure of claim 14, wherein the first doped layer, the second doped layer and the third doped layer have same doping type.

* * * * *